US008492179B2

(12) United States Patent
Brunner et al.

(10) Patent No.: US 8,492,179 B2
(45) Date of Patent: Jul. 23, 2013

(54) METHOD OF MOUNTING A LED MODULE TO A HEAT SINK

(75) Inventors: Jos George Antony Brunner, Eindhoven (NL); Wouter Oepts, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 19 days.

(21) Appl. No.: 13/002,573

(22) PCT Filed: Jun. 10, 2009

(86) PCT No.: PCT/IB2009/052999

§ 371 (c)(1),
(2), (4) Date: Jan. 4, 2011

(87) PCT Pub. No.: WO2010/004524

PCT Pub. Date: Jan. 14, 2010

(65) Prior Publication Data

US 2011/0111536 A1 May 12, 2011

(30) Foreign Application Priority Data

Jul. 11, 2008 (EP) .................................... 08160191

(51) Int. Cl.
*H01L 21/00* (2006.01)

(52) U.S. Cl.
USPC .............................. 438/26; 438/106; 438/122

(58) Field of Classification Search
USPC ............ 257/79, 99, 678, 685, 686, 710, 712, 257/729, 730, 731, E23.001, E23.003, E23.004, 257/E23.08, E23.083, E23.084, E21.499, 257/E21.5, E23.101; 438/106, 122, 26, FOR. 157, FOR. 415, FOR. 416, FOR. 417, 22, 438/110, 111, 112, 121, 800, FOR. 340, FOR. 369, FOR. 381; 362/800, 294
See application file for complete search history.

(56) References Cited

U.S. PATENT DOCUMENTS

| | | | | |
|---|---|---|---|---|
| 5,513,082 | A | 4/1996 | Asano | |
| 6,492,725 | B1 | 12/2002 | Loh et al. | |
| 6,799,864 | B2 | 10/2004 | Bohler et al. | |
| 7,138,667 | B2 | 11/2006 | Barnett et al. | |
| 7,176,502 | B2 | 2/2007 | Mazzochette et al. | |
| 7,253,449 | B2 | 8/2007 | Wu | |
| 2005/0068776 | A1 * | 3/2005 | Ge | 362/296 |
| 2005/0162864 | A1 | 7/2005 | Verdes et al. | |
| 2006/0018099 | A1 | 1/2006 | Chen | |
| 2006/0198147 | A1 | 9/2006 | Ge | |
| 2007/0139895 | A1 * | 6/2007 | Reis et al. | 361/719 |
| 2007/0145383 | A1 | 6/2007 | Rho et al. | |
| 2008/0264603 | A1 * | 10/2008 | Colbert et al. | 165/80.2 |
| 2008/0273341 | A1 * | 11/2008 | Wilcox et al. | 362/373 |
| 2009/0154166 | A1 * | 6/2009 | Zhang et al. | 362/294 |

FOREIGN PATENT DOCUMENTS

| | | | |
|---|---|---|---|
| WO | 2007034361 | A1 | 3/2007 |
| WO | 2007075143 | A1 | 7/2007 |

* cited by examiner

*Primary Examiner* — Olik Chaudhuri
*Assistant Examiner* — Quovaunda V Jefferson
(74) *Attorney, Agent, or Firm* — Mark L. Beloborodov

(57) ABSTRACT

A method of mounting a light emitting diode (LED) module (100) to a heat sink (102), the method comprising the steps of placing the LED module (100) in a hole (120) in the heat sink (102); and expanding a portion of the LED module (100) such that the LED module (100) is secured to the heat sink (102). The method provides a cost efficient way of securing an LED module to a heat sink where the mount has a high reliability over time.

7 Claims, 4 Drawing Sheets

METHOD OF MOUNTING A LED MODULE TO A HEAT SINK

FIELD OF THE INVENTION

The present invention relates to a method of mounting an LED module to a heat sink.

BACKGROUND OF THE INVENTION

To facilitate mounting of LED packages, it has been proposed to arrange the LED package in an LED module which can be screwed and/or glued to the heat sink.

WO 2007/075143A1 discloses a high power LED housing consisting of one or more LEDs to form an LED assembly fitted into a metal body having an upper portion and a lower portion. The lower portions of the LED housing has threads on its exterior surface for screwing the LED housing into a socket shaped in a heat sink.

However, an arrangement where the LED module is screwed to the heat sink requires additional manufacturing steps as the heat sink and the LED housing must be provided with threads. Further, the use of adhesives typically reduces the reliability over time for the device as the temperature generated by the LED package affects the adhesive. Thus, there is a need for an improved method of mounting an LED module to a heat sink.

SUMMARY OF THE INVENTION

It is an object of the present invention to at least partly overcome these problems, and to provide an improved method for mounting an LED module to a heat sink. In particular, it is an object to provide a method for mounting of an LED module to a heat sink that enables an enhanced reliability over time while remaining cost efficient.

According to an aspect of the invention, there is provided a method of mounting a light emitting diode (LED) module to a heat sink, the method comprising the steps of placing the LED module in a hole in the heat sink; and expanding a portion of the LED module such that the LED module is secured to the heat sink.

An advantage is that the LED module can be mounted to the heat sink without first preparing threads on the LED module and the heat sink. Furthermore, the mount does not rely on an adhesive for attaching the LED module to the heat sink, resulting in an enhanced reliability over time as the mount is less sensitive to changes in temperature (and to stress resulting from changes in temperature). Thus, the method provides a cost efficient way of securing an LED module to a heat sink where the mount has a high reliability over time. Furthermore, the method can be performed manually or be part of an automated manufacturing process.

The step of expanding a portion of the LED module may comprise deforming a portion of the LED module such that the circumference of the deformed portion is expanded beyond the circumference of the hole. As a result, the expanded portion cannot pass through the hole, whereby the LED module may be secured to the heat sink.

The method may further comprise the step of preparing the hole in the heat sink.

The step of expanding a portion of the LED module may be performed using a tool adapted engage the LED module and deform a portion of the LED module such that the circumference of the deformed portion is expanded. The tool provides a convenient and repeatable way of deforming the LED module, manually or in automated process, thereby providing a reliable way of mounting the LED module to the heat sink and reducing the risk of manufacturing defects.

The LED module may comprise a ring-shaped end portion, the step of placing the LED module in the hole in the heat sink may comprise inserting the ring-shaped end portion of the LED module into the hole, and the step of expanding a portion of the LED module may comprise deforming the ring-shaped portion such that the diameter of the ring-shaped portion is increased. An advantage of this is that a ring-shaped end portion enables symmetrical deformation of the LED module resulting in a more reliable mounting as the stresses are uniformly distributed across the ring-shaped portion. Furthermore, an associated circular hole in the heat sink is easy to manufacture and the end portion can be easily fitted to the hole. Here, the tool may be adapted to engage the inside of the ring-shaped end portion and force the ring-shaped end portion outwards such that the diameter of the ring-shaped portion is increased.

Further, the hole in the heat sink may be a through hole extending from one side of the heat sink to an opposite side of the heat sink, wherein the LED module may be inserted into the hole from one of said sides, and the tool engages the LED module from the other one of said sides.

Also, the LED module may comprise a stop element having a circumference larger than that of the hole. This provides a convenient and repeatable way to arrange the LED module in the appropriate position before expanding the end portion thereby reducing the risk of manufacturing defects. It also enables the LED module to be fixedly attached to the heat sink as the LED module cannot be moved in either direction after the end portion has been expanded.

In a preferred embodiment, the LED module comprises a cylinder-shaped body having the ring-shaped end portion, the hole in the heat sink is circular having a diameter substantially corresponding to that of the cylinder-shaped body, the height of the cylinder-shaped body is larger than the height of the hole, and the stop element is an annular element arranged on the outside of the cylinder-shaped body at a distance from the ring-shaped end portion substantially corresponding to the height of the hole.

According to another aspect of the invention there is provided a light emitting diode (LED) module mounted to a heat sink according to the above described method.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings, where the same reference numerals will be used for similar elements, wherein.

DETAILED DESCRIPTION

Figure 1A:
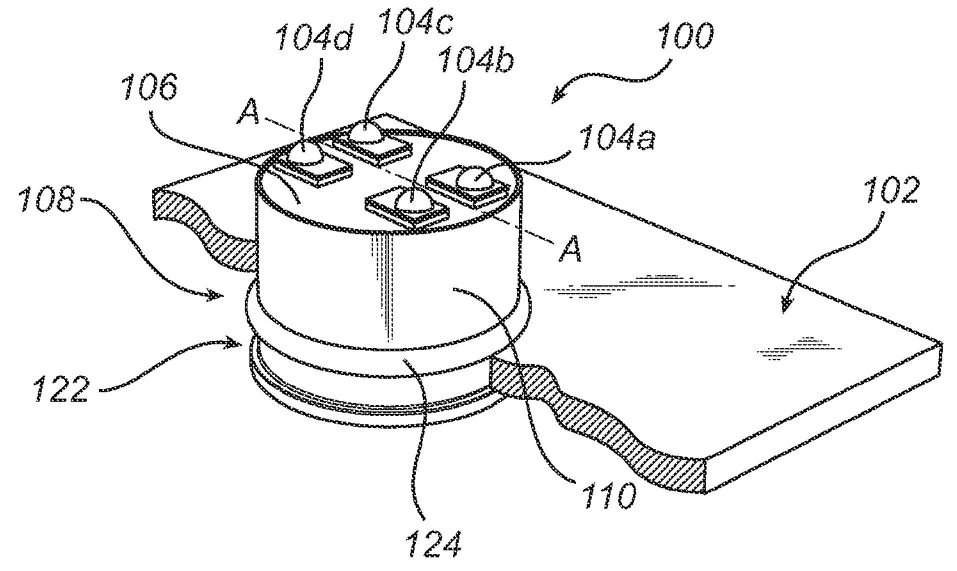
FIG. 1*a* illustrates an LED module arranged in a heat sink.
Figure 1B:
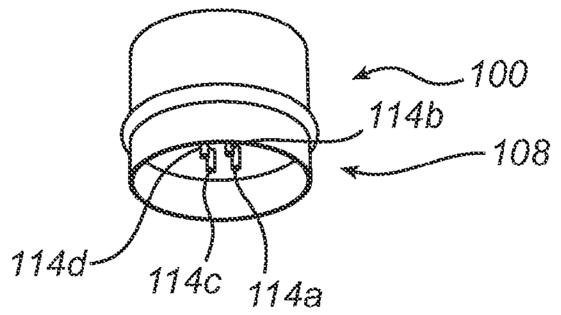
FIG. 1*b* illustrates the LED module from a different view.
Figure 1C:
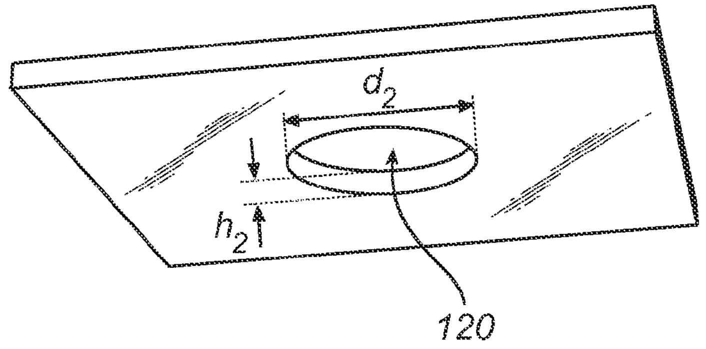
FIG. 1*c* illustrates the heat sink.
Figure 1D:
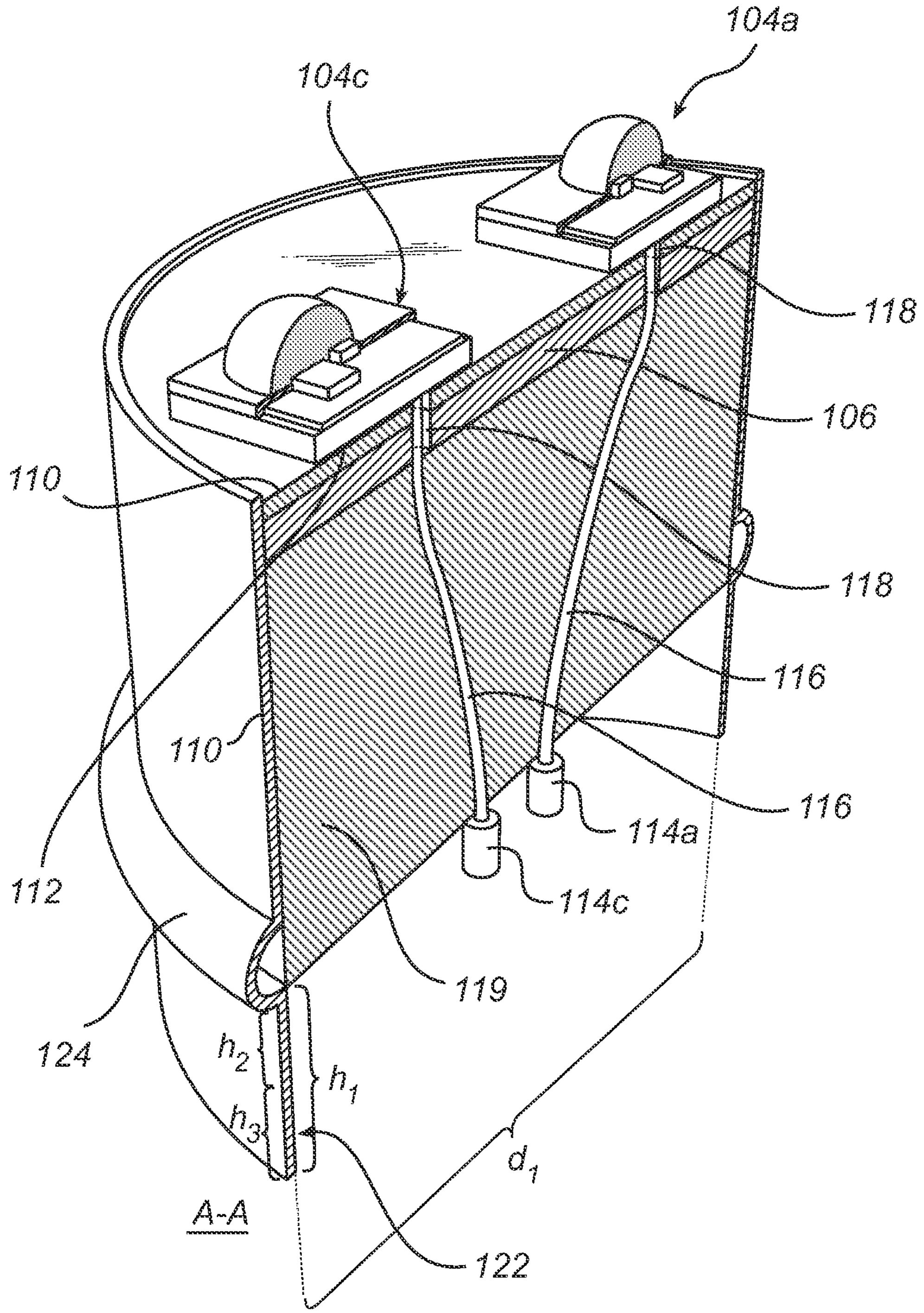
FIG. 1*d* is a cross-sectional view of the LED module.

Referring now to the drawings and to FIG. 1*a-b* in particular, there is depicted an LED module 100 having a cylinder shaped body 108. The LED module is arranged on a heat sink

102, which may be part of a lamp housing comprising a socket (not shown) to which the LED module 100 may be connected. The LED module 100 comprises four LED packages 104*a-d* mounted on a printed circuit board (PCB) 106 arranged at the top of the cylinder shaped body 108. The LED packages may be standard packages, such as, for example, LUXEON® REBEL from Philips. The cylinder shaped body 108 is covered with a thermally conductive casing 110 made of a material having a high thermal conductivity, such as metal, e.g. aluminum. The thickness of the casing range from 0.5-1.5 mm depending on the material in the casing. By arranging an electrically insulating thermal pad 112 of a material having high thermal conductivity between each LED package 104*a-d* and the PCB 106, and connecting the bottom of the PCB metallization to the thermally conductive casing 110 of the cylindrical body 108, a thermal path can be established from the LED package 104*a-d*, via the thermally conductive casing 110, to the heat sink 102.

The LED module 100 is further provided with electrical contacts 114*a-d*, here being male connectors arranged at the base of the cylindrically shaped body 108. This enables the LED module 100 to be connected to corresponding female connectors provided in the socket (not shown) in the lamp housing. Here, each LED package 104*a-d* is connected to its respective electrical contacts 114*a-d* via electrical conductors 116. The electrical conductors 116 are led via openings 118 in the PCB 106 and thermally conductive casing 110, through the cylinder shaped body 108, to the electrical contacts 114*a-d*. By having the four LED packages 104*a-d* share a common cathode, five electrical contacts are required to drive the four LED packages 104*a-d* (four anodes and one cathode). However, in the illustrated embodiment the casing is used as a cathode, why only the four anodes 114*a-d* are depicted. The thermally conductive casing 110 can be electrically insulated from the electrical conductors 116 by means of plastic insert moulding. Thus, the inner material 119 is typically (non-conductive) plastic, such as, polypropylene, or polyamide. The heat sink 102 is provided with a circular through hole 120. The diameter, $d_1$, of the cylinder-shaped body 108 essentially corresponds to the diameter, $d_2$, of the hole 120 in the heat sink 102, such that the cylinder-shaped body 108 may be inserted into the hole 120. Furthermore, as the cylinder-shaped body 108 is arranged in the hole, this enables the thermally conductive casing 110 to be in contact with the side wall of the hole thereby providing an efficient thermal path to the heat sink 102.

A stop element 124 in the form of an annular element 124 is arranged on the outside of the cylinder-shaped body 108, wherein the diameter of the stop element is larger than that of the hole 120. The stop element 124 is arranged at a distance $h_1$ from the bottom of the cylinder shaped body 108, which distance $h_1$ is larger than the height $h_2$ of the hole 120. The portion of the cylinder-shaped body 108 that will extend beneath the heat sink 102 as the LED module 100 is arranged in the hole 102 is referred to as a ring-shaped end portion 122 and has a height $h_3$.

The dimensions of the LED module may vary, e.g. depending on number of LED dies, but the diameter is typically about 1 cm, whereas the height is typically about 1.5 cm.

Figure 2A:
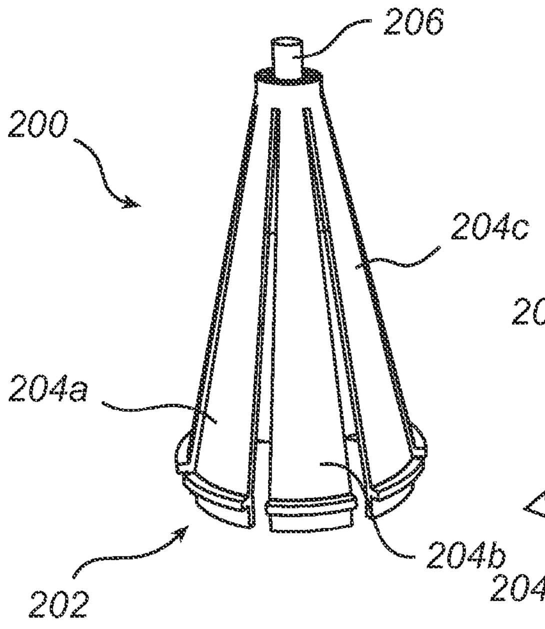
FIGS. 2*a-b* illustrate a tool usable for mounting the LED module to the heat sink.
Figure 2B:
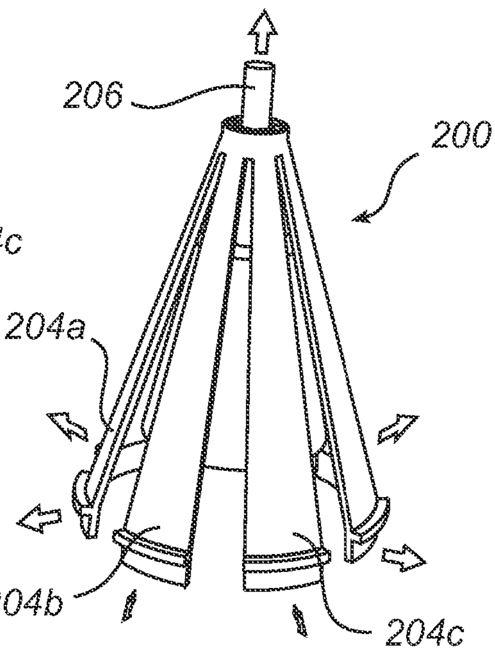

FIG. 2*a-b* illustrates a tool 200 adapted to engage the end portion 122 of the LED module 100 and deform a portion thereof such that the deformed portion is expanded. The tool is here an expanding mandrel 200 with a top 202 adapted to engage with the end portion 122 of the LED module 100. The top 202, which here has a circular cross section, comprises a plurality of expansion pieces 204*a-c*. The expanding mandrel is configured such that when a force is exerted on a centre piece 206, the expansion pieces 204*a-c* are pressed (radially) outwards. The part of the tool that engages the end portion 122 is typically made of metal or some other firm material. It is recognized by a person skilled in the art that the tool may have a variety of designs, and be manually operable or automated. For example, in its simplest form, the tool may be a cylindrical piece of metal having a slightly tapered top, wherein the top of the tool is engaged with the inside of the ring-shaped end portion and a force is applied to the tool, for example by beating with a hammer, whereby the ring-shaped end portion can be pressed (radially) outwards such that the diameter of the ring-shaped portion is increased.

Referring to FIG. 3, a method of mounting an LED module to a heat sink 102 according to the present invention will now be described.

A heat sink 102 having a predrilled circular through hole, and an LED module 100 having a cylinder shaped body is provided. The heat sink 102 and LED module 100 are preferably of the type described above.

Figures 3A, 3B, 3C, 3D, 3E:
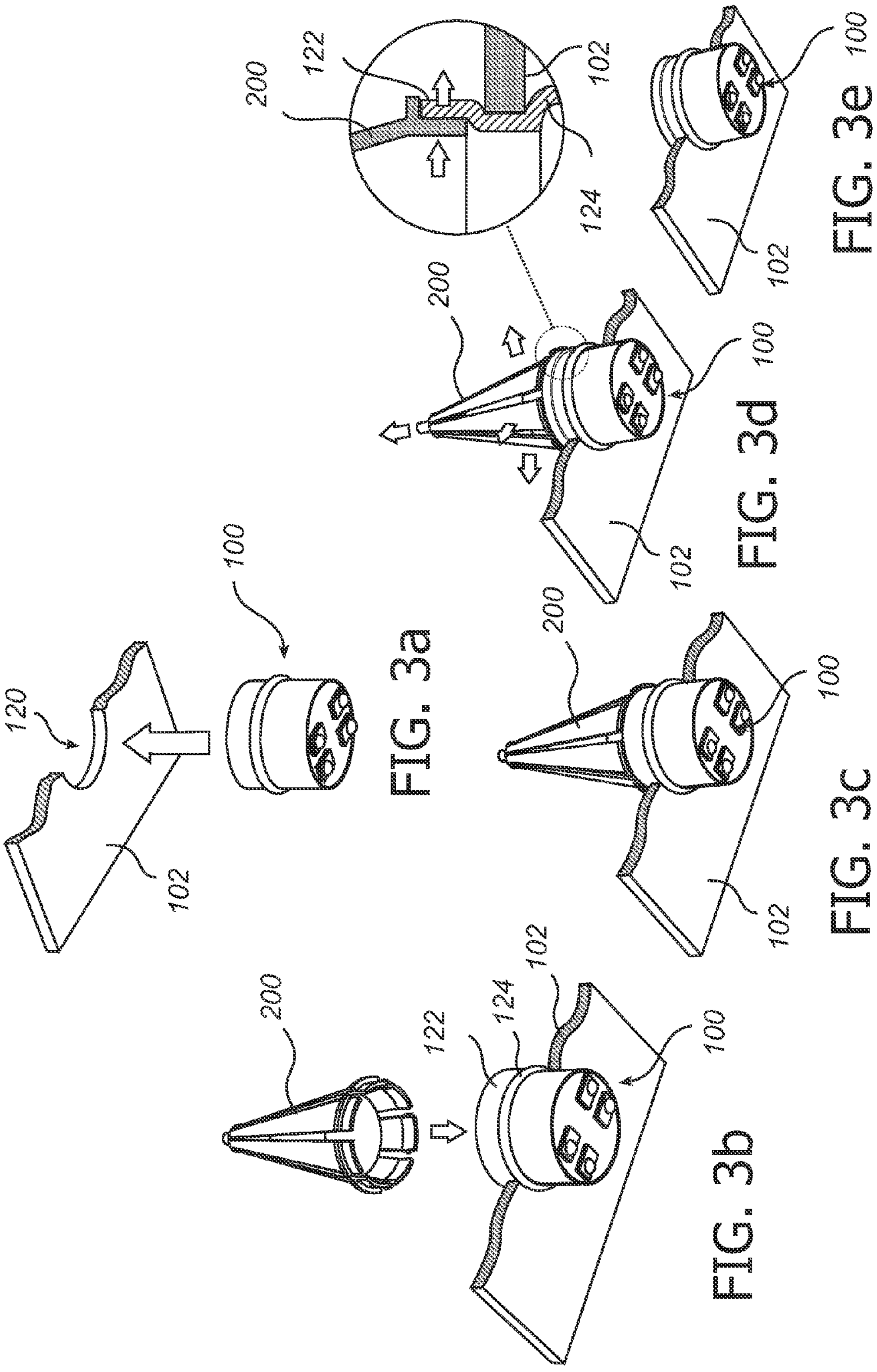
FIGS. 3*a-e* illustrate steps of mounting the LED module to the heat sink according to the present invention.

First (as illustrated in FIGS. 3*a*-3*b*) the end portion 122 of the cylinder shaped body 108 is placed in the hole 120 from a first side of the heat sink 102. The stop element 124 prevents the LED module 100 from going through the hole 120, and ensures that a suitable length of the end portion 122 protrudes on a second side of the heat sink. Then (as illustrated in FIG. 3*c*) a tool, such as the expansion mandrel described above, engages the inside of the end portion 122 of the cylinder shaped body 108 from the second side of the heat sink 102.

Then (as illustrated in FIG. 3*d*) the expansion pieces of the mandrel are pressed out, whereby a portion of the end portion 122 is deformed and expanded from its previous normal state. The deformation is here essentially symmetrical around the perimeter of the end portion. As the end portion is expanded it will have a circumference larger than the diameter of the hole, whereby the LED module 100 will be secured to the heat sink, and the tool can be removed (as illustrated in FIG. 3*e*). The casing should be made of a material exhibiting plastic deformation, i.e. a deformation which is not reversible. An example would be aluminum, which can advantageously be used due to its heat conductive properties.

Furthermore, the force applied by the expansion mandrel typically will expand the thermally conductive casing 110 to some extent inside the hole as well, so that the thermally conductive casing is pressed against the inside of the hole. This further promotes the heat transfer between the thermally conductive casing and the heat sink, and thus the thermal path from the LED package to the heat sink.

The person skilled in the art realizes that the present invention by no means is limited to the preferred embodiments described above. On the contrary, many modifications and variations are possible within the scope of the appended claims. For example, even though the design of the LED packages, the related circuitry, and/or how the thermal path is established to the heat sink is modified, the mounting method may still be equally applicable. Furthermore, the shape of the LED module may vary. For example, instead of using a cylindrically shaped body it would be possible to use an LED module having a body with a polygonal cross-section, such as, rectangular or hexagonal.

Furthermore, the stop element is not limited to a continuous annular element arranged along the perimeter of the LED module, but may for example be a set of discontinuous elements, such as four separate elements distributed across the circumference.

Although, the mounting method has been described in relation to LEDs, it may also be utilized for other light sources that needs a heat sink to get rid of the generated heat, such as, for example, organic LEDs.

The invention claimed is:

1. A method of mounting a light emitting diode (LED) module to a heat sink, the method comprising the steps of:

placing the LED module in a hole in the heat sink from one side of the heat sink, such that a portion of the LED module extends from an opposite side of the heat sink; and expanding the portion of the LED module extending from the heat sink such that the portion is deformed and the LED module is secured to the heat sink, wherein the circumference of the deformed portion is expanded beyond the circumference of the hole.

2. A method according to claim 1, wherein the step of expanding a portion of the LED module is performed using a tool adapted to engage the LED module and deform a portion of the LED module such that the circumference of the deformed portion is expanded.

3. A method according to claim 1, wherein the LED module comprises a ring-shaped end portion, the step of placing the LED module in the hole in the heat sink comprises inserting the ring-shaped end portion of the LED module into the hole, and the step of expanding a portion of the LED module comprises deforming the ring-shaped portion such that the diameter of the ring-shaped portion is increased.

4. A method according to claim 3, wherein the ring-shaped end portion is engaged and forced outwards such that the diameter of the ring-shaped portion is increased.

5. A method according to claim 2, wherein the LED module is inserted into the hole from one of said sides, and is engaged from the other one of said sides.

6. A method according to claim 5, wherein the LED module comprises a stop element having a circumference larger than that of the hole.

7. A method according to claim 6, wherein the LED module comprises a cylinder-shaped body having the ring-shaped end portion, the hole in the heat sink is circular having a diameter substantially corresponding to that of the cylinder-shaped body, the height of the cylinder-shaped body is larger than the height of the hole, and the stop element is an annular element arranged on the outside of the cylinder-shaped body at a distance from the ring-shaped end portion substantially corresponding to the height of the hole.

* * * * *